United States Patent
Ho et al.

(10) Patent No.: US 9,058,898 B1
(45) Date of Patent: Jun. 16, 2015

(54) APPARATUS FOR REDUCING READ LATENCY BY ADJUSTING CLOCK AND READ CONTROL SIGNALS TIMINGS TO A MEMORY DEVICE

(71) Applicants: Ming-Jing Ho, Hsinchu (TW); Shih-Lun Chen, Taipei (TW); Yu-Ming Sun, Hsinchu (TW)

(72) Inventors: Ming-Jing Ho, Hsinchu (TW); Shih-Lun Chen, Taipei (TW); Yu-Ming Sun, Hsinchu (TW)

(73) Assignees: Global Unichip Corp., Hsinchu (TW); Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 14/256,998

(22) Filed: Apr. 21, 2014

(51) Int. Cl.
*G11C 7/00* (2006.01)
*G11C 11/4076* (2006.01)
*G11C 11/4091* (2006.01)

(52) U.S. Cl.
CPC ........ *G11C 11/4076* (2013.01); *G11C 11/4091* (2013.01)

(58) Field of Classification Search
CPC ....... G11C 7/22; G11C 7/222; G11C 11/4076
USPC ........................................ 365/194, 195, 233.1
See application file for complete search history.

(56) References Cited

U.S. PATENT DOCUMENTS 7,292,486 B2 * 11/2007 Lee ................................ 365/194

* cited by examiner

*Primary Examiner* — Son Dinh
(74) *Attorney, Agent, or Firm* — Min-Lee Teng; Litron Patent & Trademark Office

(57) ABSTRACT

The present invention discloses an efficient way to read data from a memory device by aligning an internal clock of the memory interface circuit with the read data strobe signal from the memory device by delaying the internal clock along with control signals for reading the memory device before transmitting them to the memory device, wherein the internal clock of the memory controller can sample the read data from the memory device directly without using a FIFO device between the internal clock and the read data strobe so as to reduce latency of reading data from the memory device. For example, the memory device can be a double-data-rate (DDR) DRAM device, and the control signals includes command and address signals of the DDR DRAM device.

18 Claims, 4 Drawing Sheets

APPARATUS FOR REDUCING READ LATENCY BY ADJUSTING CLOCK AND READ CONTROL SIGNALS TIMINGS TO A MEMORY DEVICE

BACKGROUND OF THE INVENTION

1. Field of the Invention

The invention relates in general to a circuit for accessing data from a memory device and, in particular, to a circuit for reading data from a memory device using a data strobe to transfer data.

2. Description of Prior Art

FIG. 1A shows a conventional memory interface between a double data rate (DDR) dynamic random access memory (DRAM) device and a physical layer PHY in a memory controller, wherein a clock signal CLK, command signals CMD and address bits ADD are one way signals from a physical layer PHY to the DRAM device, and DQ/DQS are bidirectional signals. For a write operation, the physical layer PHY sends a write command to the DRAM device and then sends write data and write data strobe DQ/DQS to the DRAM device; for a read operation the physical layer PHY sends a read command to the DRAM device and then the DRAM device sends read data and read data strobe DQ/DQS back to the physical layer PHY.

FIG. 1B shows a conventional memory interface circuit connecting to a DRAM in which the memory interface circuit sends a read command CMD and address bits ADD along with a clock signal CLK through the memory interface to the DRAM, which then sends back read data strobe and read data DQ/DQS back to the memory interface in the memory controller. The received read DQS, RD_DQS, is shifted 90 degree in PHY to obtain RD_QDS90 for capturing the incoming data DQ. The PHY_CLK is transmitted through a buffer to obtain a clock signal CLK which is actually received by the memory device; and a FIFO is needed in the read path of the memory interface for synchronization between the internal clock PHY_CLK and the RD_QDS90 since the read DQS/DQ from the DRAM has no phase relationship with PHY_CLK due to PCB trace, PKG, IO, and DRAM delays.

FIG. 1C shows a timing diagram for various signals in the memory interface for a read operation. The PHY_CLK is aligned with the DDR_CLK which is actually received by the DRAM. In FIG. 2, the frequency of the PHY_CLK is twice the frequency of the DDR_CLK and the rising edge of the PHY_CLK is aligned with edges of the DDR_CLK. Because the RD_QDS90 is not aligned with the PHY_CLK, a FIFO is needed for synchronization, which will introduce read latency.

Due to power saving and noise issues, IOs, such as transmitters TXs, receivers RXs, and related circuits are only turned on in the actual read/write operations. In order to control the transmitters TXs and receivers RXs, a gate training to position a gate signal for turning on and off the transmitters TXs and receivers RXs is necessary. FIG. 1D shows a timing diagram for various signals for a gate training sequence. As shown in FIG. 1D, the gate training is performed by sending a read command, and then a gate signal GATE will be delayed to match the time window when the read DQS is back. After the gate signal is positioned, the gate signal can turn on the receivers RXs so that the read strobe signal and read data can be received through the receivers RXs to obtain the received read data strobe RD_DQS and received read data RD_DQ and the RD_DQS is shifted by 90 degree to sample the received read data RD_DQ.

Conventionally, a phase lock loop/delay locked loop (PLL/DLL) can be used for synchronization between two clock domains. Typically a digital DLL uses chains of delay elements in delay lines to produce locked delays. For example, a quarter cycle delay may be used to delay the read strobe signal.

FIG. 2 is a flowchart illustrating a write training of a semiconductor memory device, as disclosed in US patent publication (US20120284470A1), to adjust the phase of a data clock in order to get the maximum data valid window for capturing write data.

Referring to FIG. 2, the training performed between the semiconductor memory device and the data processor includes operation S301 of loading a data pattern, operation S302 of transferring the data pattern, operation S303 of checking an arrival time of the data pattern, operations S304 and S305 of advancing or delaying phase of the data clock, operation S306 of determining if an interface corresponds to data input/output timing after adjusting the phase of the data clock with respect to the arrival time of the data pattern, and operation S307 of adjusting the interface (UI) when the interface (UI) does not correspond to the data input/output timing. The operation S301 of loading the data pattern and the operation S302 of transferring the data pattern are performed by the semiconductor memory device, and the other operations S303 to S307 are performed by the data processor. However, the above disclosure in US patent publication (US20120284470A1) is for a write operation inside a memory device, not for a read operation in a memory controller or a memory interface circuit.

Conventional way to read data from DDR DRAM devices is to adjust read data strobe timing in the read data path, which requires a FIFO for synchronization between the read data strobe and the internal clock. Therefore, what is needed is an efficient way to read data from a memory device without using the FIFO for the synchronization.

SUMMARY OF THE INVENTION

One objective of present invention is to provide an efficient way to read data from a memory device by aligning an internal clock of a memory interface circuit with the read data strobe signal from the memory device by delaying the internal clock and control signals for reading data from the memory so that the internal clock can sample the read data directly, thereby reducing latency of reading data from the memory device by eliminating the need to use a FIFO for synchronization between the internal clock and the read data strobe signal.

In one embodiment, a memory interface circuit for reading data from a memory device is closed, the memory interface circuit comprises: a delay adjustment circuit, for setting up a delay time for each of a first clock signal and a set of control signals and outputting the delayed first clock signal and the set of delayed control signals for reading a first data from the memory device; and a transmitting circuit, for transmitting the delayed first clock signal and the set of delayed control signals to the memory device to read the first data; wherein the delay times of the first clock signal and the first set of control signals are respectively adjusted such that a second clock signal is synchronized with a read strobe signal from the memory device for capturing the first data associated with the read strobe signal, wherein the frequency of the second clock signal is equal to or twice the frequency of the first clock signal.

In one embodiment, the frequency of the second clock signal is equal to the frequency of the first clock signal.

In one embodiment, the frequency of the second clock signal is twice the frequency of the first clock signal.

In one embodiment, the first memory interface circuit further comprises a phase shifter to phase shift the read strobe signal 90 degree, wherein a rising edge of the second clock signal is aligned with a rising edge of the phase-shifted read strobe signal.

In one embodiment, the memory device is a DDR DRAM device, wherein the first set of control signals comprises command signals and address signals.

In one embodiment, the first memory interface circuit further comprises a plurality of registers clocked by the first clock signal, wherein the plurality of registers generate the command signals and address signals at a rising edge or at a falling edge of the first clock signal.

In one embodiment, the first memory interface circuit further comprises a plurality of registers clocked by the first clock signal, wherein the plurality of registers generate the command signals and address signals at a rising edge of the second clock signal.

In one embodiment, the second memory interface circuit further comprises a plurality of registers clocked by the second clock signal, wherein the first data is captured by the second plurality of registers at rising edges of the second clock signal.

In one embodiment, the second memory interface circuit further comprises a plurality of registers clocked by the second clock signal, wherein the first data is captured by the second plurality of registers at rising edges and falling edges of the second clock signal.

In one embodiment, the delay times of the first clock signal and the set of control signals are respectively adjusted by a training sequence.

In one embodiment, the memory interface circuit is disposed in an integrated circuit.

BRIEF DESCRIPTION OF DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF EMBODIMENT

The detailed explanation of the present invention is described as following. The described preferred embodiments are presented for purposes of illustrations and description, and they are not intended to limit the scope of the present invention.

In this invention, a circuit for reading data from a memory device is disclosed. Compared with conventional circuits, the disclosed circuit eliminates the need for a FIFO structure in the read path and provides increased speeds.

Figure 1A:
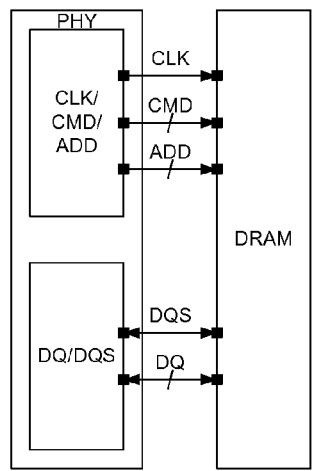
FIG. 1A shows a conventional double data rate (DDR) dynamic random access memory (DRAM) interface.
Figure 1B:
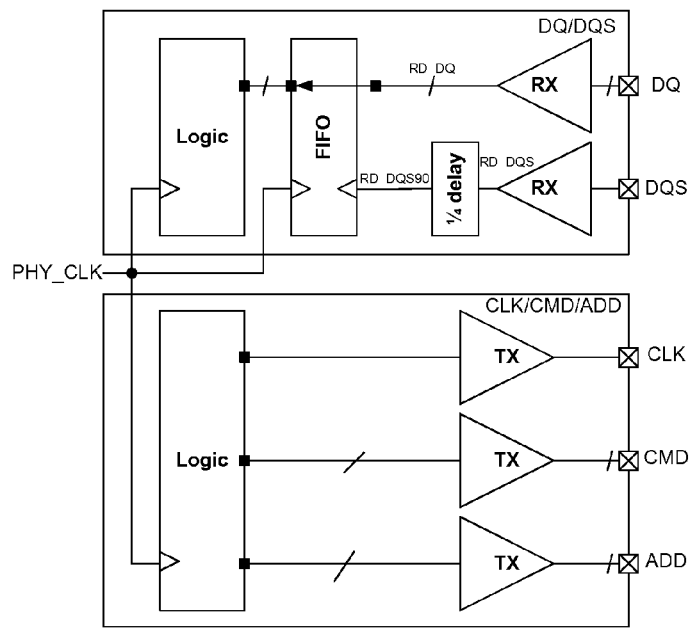
FIG. 1B shows a conventional DDR DRAM memory interface circuit.
Figure 1C:
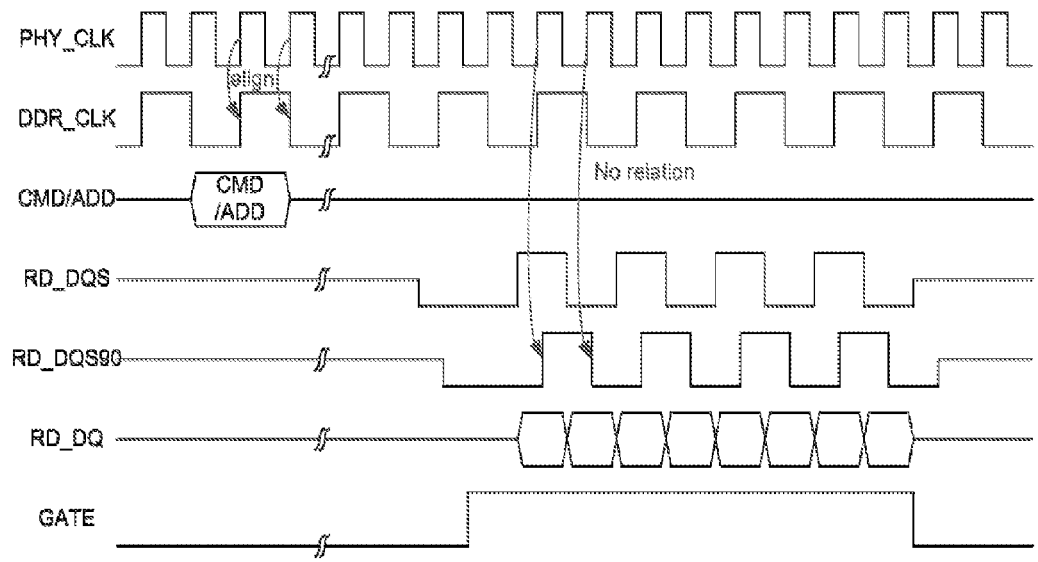
FIG. 1C shows a timing diagram for various signals in the memory interface for a read operation.
Figure 1D:
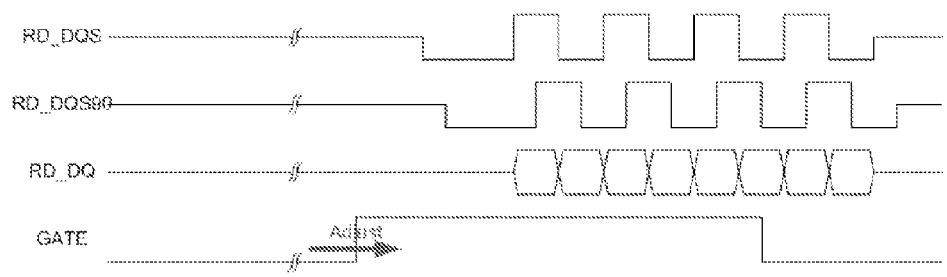
FIG. 1D shows a timing diagram for various signals for a gate training sequence.
Figure 2:
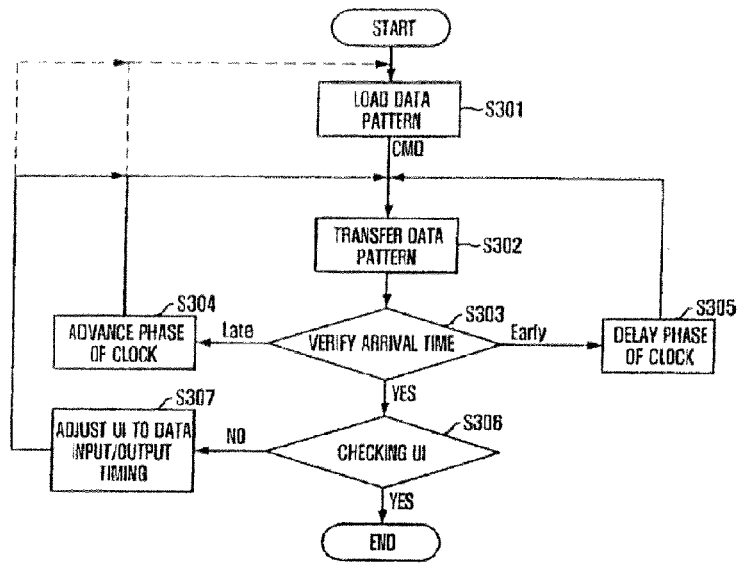
FIG. 2 shows a flow chart of a training sequence for adjusting data clock disclosed in US patent publication (US20120284470A1)
Figure 3:
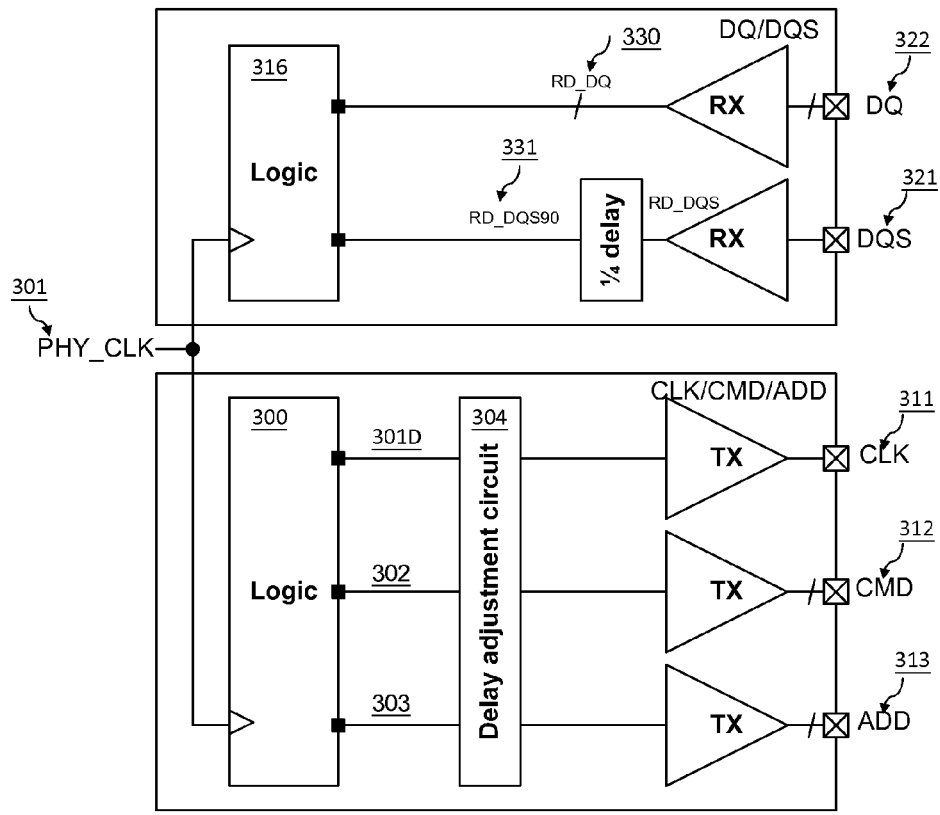
FIG. 3 illustrates a circuit for reading from a memory device in accordance with one embodiment of this invention.

Please refer to FIG. 3 which illustrates a memory interface circuit for reading data from a memory device in accordance with one embodiment of this invention. The memory interface circuit comprises: a logic block 300 for generating command signals 302 and address signals 303 for reading a first data in accordance with a physical clock signal 301, wherein the logic block 300 has a plurality of registers and the physical clock signal 301 clocks all the plurality of registers to generate the command signals 302 and the address signals 303; a delay adjustment circuit 304 for delaying the physical clock signal 301 which couples to the delay adjustment circuit 304 at an output node 301D of the logic block 300, the command signals 302 and the address signals 303 to generate a clock signal CLK 311, a second set of command signals CMD 312 and a second set of address signals ADD 313 for driving the memory device, wherein each of the physical clock signal 301, the command signals 302 and address signals 303 are respectively delayed an amount of time such that the physical clock signal 301 is synchronized with the delayed read strobe signal RD_DQS90 331, which is phase shifted from the DQS 321 by 90 degree, for capturing the received data RD_DQ 330 of DQ 322 which is associated and synchronized with the read strobe signal 321 from the memory device. In one embodiment, the memory device is a DDR DRAM.

In one embodiment, the memory interface circuit further comprises a logic block 316 having a plurality of registers for capturing the received data RD_DQ 330, wherein the logic block 316 is clocked by the physical clock signal 301.

In one embodiment, the logic block 316 is clocked by a clock signal which has the same frequency as that of the physical clock signal 301 but has a phase shift from the physical clock signal 301 for capturing the received data RD_DQ 330; in one embodiment, the phase shift is zero or 180 degree.

In one embodiment, the physical clock signal 301 has twice the frequency of the DDR DRAM clock signal CLK 311, in this case, there will be a divider in the block 300 to divide the physical clock signal 301 by 2 and the block 300 outputs the divided by 2 clock signal at the output node 301D for connecting with the delay adjustment circuit 304, or a phase lock loop (PLL) can be used to generate the physical clock signal 301 and the divided by 2 clock at the same time.

Please note that the clock signal of the logic block 300 and the clock signal of the logic block 316 can be driven by the same internal clock of the memory interface as shown in FIG. 3. However, the clock signal of the logic block 300 and the clock signal of the logic block 316 can have a phase shift between them, and the clock signal of the logic block 316 can have twice the frequency of the clock signal of the logic block 300 due to the fact that the command and address signals only toggle at the frequency of the DDR DRAM clock signal CLK 311 and the clock signal of the logic block 316 can sample the read data from the DDR DRAM by using rising edges of the clock signal of the logic block 316.

In one embodiment, each of the physical clock signal 301 or the divided by 2 clock, the command signals 302 and the address signals 303 is delayed by the same amount of time. In one embodiment, at least two signals are delayed by different amount of times to compensate layout routing delays. Please note that delaying the command and address signals along with the physical clock signal 301, or the divided by 2 clock, is to make sure the command and address signals are maintain the original sampling window relative to the DDR DRAM clock signal CLK 311; otherwise, the sampling window for capturing the command and address signals by the DDR DRAM clock signal CLK 311 will be narrowed.

In one embodiment, the delayed time of each of the physical clock signal 301, the command signals 302 and the address signals 303 is respectively adjusted by performing a training sequence to adjust delay times, wherein the first data is read back and checked to see if there is an error. In one embodiment, the memory interface circuit is disposed in an integrated circuit. In one embodiment, the interface circuit is disposed in an integrated circuit with a microprocessor for performing the training sequence.

In one embodiment, the memory interface circuit further comprises a phase comparator to compare the phase difference between the physical clock signal 301 of the logic block 316 and the read strobe signal 321, wherein when the phase difference exceeds a threshold, the delayed times of the signals are updated according to the phase difference, or alternatively, a new training sequence can be performed to set up new delay times for the signals.

In one embodiment, a delay line uses a chain of buffers, for example, one buffer may provide 10 ps of delay, 2 buffers may provide 20 ps of delay and so on. A multiplexer can be used to select one of the delay tap of the chain of buffers. Another example is a delay lock loop (DLL); a digital DLL can be used to produce a locked delay at a fraction of the incoming clock period. For example, a quarter cycle delay may be used to delay the internal clock of the memory controller before sending it out to a memory device.

Figure 4:
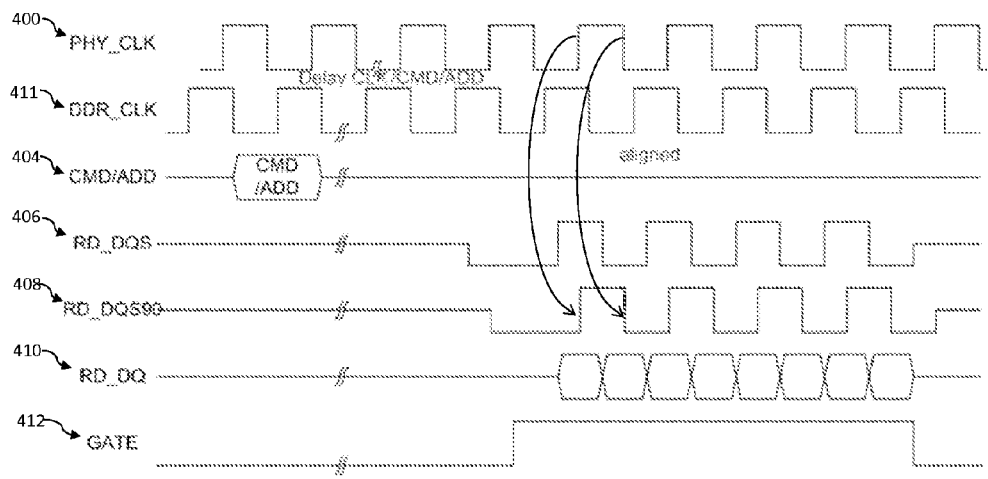
FIG. 4 illustrates a timing diagram depicting the various signals of a circuit for reading data from a memory device in accordance with one embodiment of this invention.

Please refer to FIG. 4 which illustrates a timing diagram depicting the various signals of the memory interface circuit for reading from the memory device in accordance with one embodiment of this invention. As shown in FIG. 4, the clock signal DDR_CLK 411 is delayed relative to the internal physical clock signal PHY_CLK 400 while the command and address signals CMD/ADD 404 are maintain the original timing relative to the clock signal DDR_CLK 411, after the delay times are set up by the delay adjustment circuit 304 in FIG. 3. The frequency of the PHY_CLK 400 is equal to the frequency of the DDR_CLK 411, and the rising edge of the PHY_CLK 400 is aligned with the rising edge of the RD_DQS90 408. The rising edge of the physical clock signal PHY_CLK 400 and the rising edge of the read strobe signal RD_DQS 406 have a 90 degree phase shift for capturing the received data RD_DQ 410. The gate signal 412 for controlling the transmit and receive IOs can be positioned as well.

Figure 5:
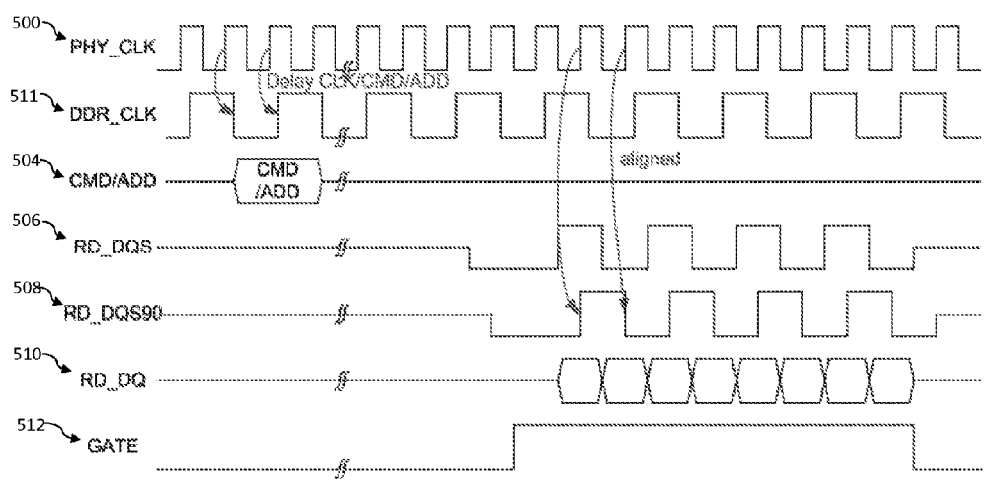
FIG. 5 illustrates a timing diagram depicting the various signals of a circuit for reading data from a memory device in accordance with another embodiment of this invention.

Please refer to FIG. 5 which illustrates a timing diagram depicting the various signals of the memory interface circuit for reading from the memory device in accordance with another embodiment of this invention. As shown in FIG. 5, the clock signal DDR_CLK 511 is delayed relative to the internal physical clock signal PHY_CLK 500 while the command and address signals CMD/ADD 504 are maintain the original timing relative to the clock signal DDR_CLK 511, after the delay times are set up by the delay adjustment circuit 304 in FIG. 3. The frequency of the PHY_CLK 500 is twice the frequency of the DDR_CLK 511. A rising edge of the PHY_CLK 500 is aligned with the rising edge and falling edge of the RD_DQS90 508. The rising edge of the physical clock signal PHY_CLK 500 and the rising edge of the read strobe signal RD_DQS 506 have a 90 degree phase shift for capturing the received data RD_DQ 510. The gate signal 512 for controlling the transmit and receive IOs can be positioned as well.

Please note that the command signals and address signals can be collectively referred as control signals for reading data from a memory device. That is, the control signals for reading data from a memory device comprise signals, other than a clock signal, that are transmitted to a memory device in order to read data from the memory device. For DDR DRAM, the control signals include the command signals and address signals that are transmitted to the DDR DRAM to read data from the DDR DRAM.

In summary, in a DDR memory interface design, the phase relation between the read data strobe and the internal clock in the memory interface circuit is unknown; present invention provides a way to reduce read latency by adjusting delay times between the internal clock/control signals and the external clock/control signals which are transmitted to a memory device, such that the internal clock can align with the read data strobe for sampling read data directly, thereby reducing read latency. The present invention is not limited to DDR DRAM devices, and it can be applied to other memory devices with similar read operations as well.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A memory interface circuit for reducing latency of reading data from a memory device, comprising:
    a delay adjustment circuit, for setting up a delay time for each of a first clock signal and a set of control signals and outputting the delayed first clock signal and the set of delayed control signals for reading a first data from the memory device; and
    a transmitting circuit, for transmitting the delayed first clock signal and the set of delayed control signals to the memory device to read the first data;
    wherein the delay times of the first clock signal and the first set of control signals are respectively adjusted such that a second clock signal is synchronized with a read strobe signal from the memory device for capturing the first data associated with the read strobe signal, wherein the frequency of the second clock signal is equal to or twice the frequency of the first clock signal.

2. The memory interface circuit according to claim 1, wherein the frequency of the second clock signal is equal to the frequency of the first clock signal.

3. The memory interface circuit according to claim 1, wherein the frequency of the second clock signal is twice the frequency of the first clock signal.

4. The memory interface circuit according to claim 2, the second clock signal and the first clock signal have zero or 180 degree phase shift.

5. The memory interface circuit according to claim 3, wherein the second clock signal and the first clock signal are generated by a phase lock loop.

6. The memory interface circuit according to claim 1, wherein the memory device is a DDR DRAM device, wherein the first set of control signals comprises command signals and address signals.

7. The memory interface circuit according to claim 1, further comprising a phase shifter to phase shift the read strobe signal 90 degree, wherein a rising edge of the second clock signal is aligned with a rising edge of the phase-shifted read strobe signal.

8. The memory interface circuit according to claim 2, further comprising a plurality of registers clocked by the second clock signal for capturing the first data at rising and falling edges of the second clock.

9. The memory interface circuit according to claim 3, further comprising a plurality of registers clocked by the second clock signal for capturing the first data at rising edges of the second clock.

10. The memory interface circuit according to claim 1, wherein the delay adjustment circuit comprises a plurality of delay lines for setting up the delay times of the first clock signal and the set of control signals, respectively.

11. The memory interface circuit according to claim 10, wherein each delay line has a plurality of delay elements, wherein a first delay line is responsible to set up the delay time of the first clock signal, wherein one delay element of the plurality of delay elements is selected for outputting the delayed first clock signal.

12. The memory interface circuit according to claim 11, wherein the first delay line comprises a delay lock loop (DLL).

13. An integrated circuit comprises a memory interface circuit recited as in claim 1.

14. The memory interface circuit according to claim 1, wherein the delay times of the first clock signal and the set of control signals are respectively adjusted by performing a training sequence.

15. The memory interface circuit according to claim 6, further comprising a plurality of registers clocked by the first clock signal for generating the command signals and the address signals.

16. The memory interface circuit according to claim 6, further comprising a plurality of registers clocked by the second clock signal for generating the command signals and the address signals.

17. The memory interface circuit according to claim 6, wherein each of the first clock signal, the command signals and addressing signals is delayed by the same amount of time.

18. The memory interface circuit according to claim 6, wherein at least two signals of the first clock signal, the command signals and the addressing signals are delayed by different amount of times to compensate layout routing delay.

* * * * *